United States Patent [19]

Masuoka

[11] 4,432,073
[45] Feb. 14, 1984

[54] SEMICONDUCTOR MEMORY DEVICE

[75] Inventor: Fujio Masuoka, Yokohama, Japan

[73] Assignee: Tokyo Shibaura Denki Kabushiki Kaisha, Kawasaki, Japan

[21] Appl. No.: 227,918

[22] Filed: Jan. 23, 1981

[30] Foreign Application Priority Data

Jan. 25, 1980 [JP] Japan .................................. 55/7531
Jan. 25, 1980 [JP] Japan .................................. 55/7533

[51] Int. Cl.³ .............................................. G11C 11/40
[52] U.S. Cl. ..................................... 365/182; 365/104
[58] Field of Search ................... 365/94, 96, 100, 103, 365/104, 105, 227, 182

[56] References Cited

U.S. PATENT DOCUMENTS

| | | | |
|---|---|---|---|
| 3,245,051 | 4/1966 | Robb | 365/96 |
| 3,529,299 | 9/1970 | Chung et al. | 365/96 |
| 3,582,908 | 6/1971 | Koo | 365/96 |
| 3,641,516 | 2/1972 | Castrucci et al. | 365/96 |
| 3,735,367 | 5/1973 | Bennett, Jr. | 365/94 |
| 4,064,493 | 12/1977 | Davis | 365/96 |
| 4,122,547 | 10/1978 | Schroeder et al. | 365/94 |
| 4,152,627 | 5/1979 | Priel | 365/94 |
| 4,185,321 | 1/1980 | Iwahashi | 365/227 |
| 4,287,569 | 9/1981 | Fukushima | 365/96 |

FOREIGN PATENT DOCUMENTS

| | | |
|---|---|---|
| 2818783 | 1/1979 | Fed. Rep. of Germany . |
| 1354915 | 5/1974 | United Kingdom . |
| 1406691 | 9/1975 | United Kingdom . |
| 1407152 | 9/1975 | United Kingdom . |
| 1518703 | 7/1978 | United Kingdom . |
| 2011178 | 7/1979 | United Kingdom . |

OTHER PUBLICATIONS

Chatterjee et al., "Circuit Optimization of the Taper Isolated Dynamic Gain RAM Cell for VLSI Memories", IEEE Solid-State Circuits Conference, pp. 22-27, dated 2/14/79.

*Primary Examiner*—Terrell W. Fears
*Attorney, Agent, or Firm*—Finnegan, Henderson, Farabow, Garrett & Dunner

[57] ABSTRACT

An insulated gate field-effect transistor is formed along a surface of a semiconductor substrate, and a polycrystalline silicon layer serving as a resistive element is formed over the gate electrode of the field-effect transistor via a thick insulating layer. The polycrystalline silicon layer is connected at one end to the drain region of the field-effect transistor and at the other end to a line for reading data. The gate electrode of the field-effect transistor is connected to a line for writing data, and the source region is connected to a common line.

10 Claims, 25 Drawing Figures

FIG. 3 (WRITE "1") PRIOR ART

FIG. 4 (INHIBIT) PRIOR ART

SEMICONDUCTOR MEMORY DEVICE

This invention relates to semiconductor memory devices and, more particularly, to semiconductor memory devices using dynamic gain RAM (random access memory) cells.

Figure 1:
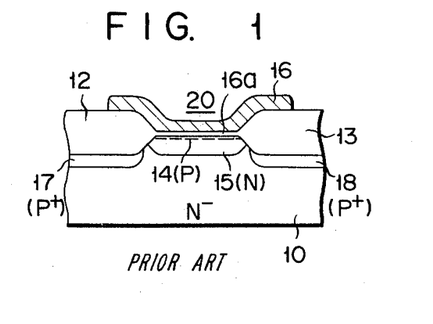
FIG. 1 is a pictorial sectional view showing the structure of a prior-art taper isolated dynamic gain RAM cell.

In the ISSCC held on Feb. 14, 1979, P. K. Chatterjee, G. W. Taylor and M. Malwah announced a taper isolated dynamic gain RAM cell having a construction as shown in FIG. 1. This RAM cell has a construction comprising two field isolation layers 12 and 13 formed on an $N^-$-type substrate 10, a P-type channel region 14 formed beneath a gate insulation layer 16a which is formed between these field isolation layers 12 and 13, and an N-type region 15 formed under the channel region 14. Over the gate insulation layer 16a a polycrystalline silicon gate layer 16 is formed, and $P^+$-type source and drain regions 17 and 18 are formed under the respective field isolation layers 12 and 13. This construction constitutes a memory cell 20.

Figure 2:
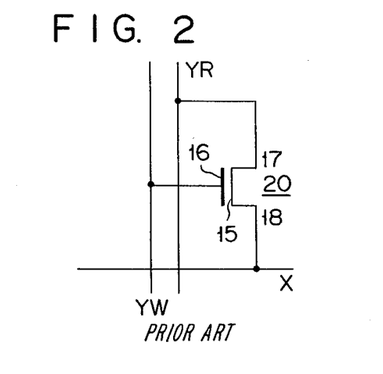
FIG. 2 is an equivalent circuit diagram of the memory cell shown in FIG. 1.

FIG. 2 shows an equivalent circuit of this memory cell 20. In FIGS. 1 and 2 corresponding parts are designated by like reference numerals. In FIG. 2, the source region 17 of the memory cell 20 is connected to a read line YR, and the drain region 18 is connected to a row line X passing over the read line YR. The gate layer 16 of the memory cell 20 is connected to a write line YW which is provided parallel to the read line YR.

In the memory cell 20 having the construction shown in FIGS. 1 and 2, charge corresponding to either bit signal "1" or "0" is stored in the N-type region 15 according to voltage applied to the gate layer 16. The conductance of the channel 14 changes according to the stored charge corresponding to either bit signal "1" or "0". In other words, unlike the ordinary memory cell, in which the memorized data "1" or "0" is directly read out in terms of the stored charge, in the memory cell 20 shown in FIGS. 1 and 2 the data "1" or "0" is read out as a conductance that changes according to the stored charge.

Figure 3:
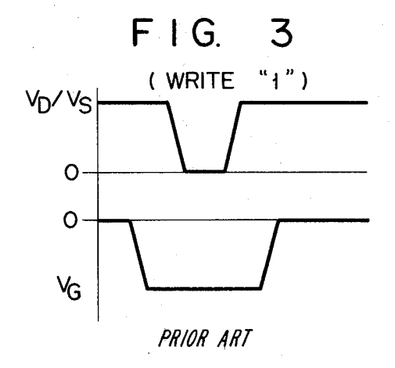
FIGS. 3 and 4 are waveform charts for illustrating the operation of the memory cell shown in FIG. 1.
Figure 4:
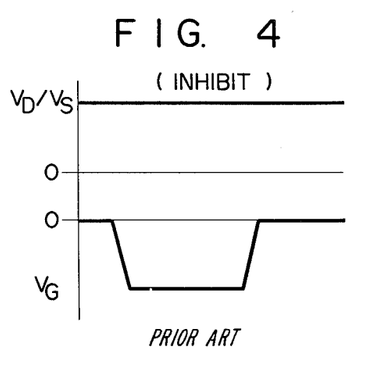

It is shown in the ISSCC's technical paper digest of February 1979, pages 22 through 23, that with the memory cell having the construction mentioned above, data is written in the following way. For writing data "1", the potentials $V_S$ and $V_D$ on the source and drain regions 17 and 18 have to be simultaneously changed from +5 V to 0 V as shown in FIG. 3. In this case, the gate potential $V_G$ has been changed from 0 V to −5 V. For inhibiting the writing of "1", both the source and drain regions 17 and 18 have to be held at +5 V as shown in FIG. 4. Again in this case, the gate potential $V_G$ has been changed from 0 V to −5 V. It will be seen that with this construction both the source and drain potentials $V_S$, $V_D$ are changed in the writing and write inhibiting operations. This means that, for writing data, lines X, YR and YW shown in FIG. 2 are necessary for each memory cell. In other words, it is impossible, for example, to use the line X as a common line and permit the selection of one of lines YW as a column line. Therefore, it is impractical or infeasible to use the memory structure of FIGS. 1 and 2 for high density memory devices.

An object of the invention, accordingly, is to provide a semiconductor memory device using dynamic gain RAM cells, which is capable of high density integration.

According to the invention, there is obtainable a semiconductor memory device, which comprises a semiconductor substrate, a field-effect transistor formed on the principal surface of the substrate, a resistive element having one end connected to either the source or drain region of the field-effect transistor, a first connecting means connecting the other end of the resistive element to a first column line for reading data, a second connecting means connecting the other of the source and drain regions to a row line for reading and writing data and a third connecting means connecting the gate electrode of the field-effect transistor to a second column line for writing data.

Also, according to the invention there is obtainable a semiconductor memory device which comprises a semiconductor substrate of a first conductivity type, a first buried region of a second conductivity type formed along the principal surface of the substrate, a second buried region of the first conductivity type formed within the first buried region, and a field-effect transistor having source and drain regions formed in the first buried region and a gate electrode formed over the substrate surface between the source and drain regions via an insulating film.

This invention can be more fully understood from the following detailed description when taken in conjunction with the accompanying drawings, in which.

Figure 5:
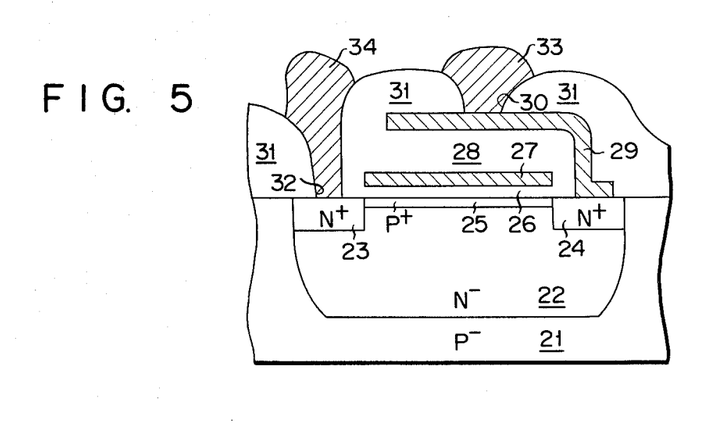
FIG. 5 is a pictorial sectional view showing an embodiment of the invention applied to a dynamic gain RAM cell.

Now, preferred embodiments of the invention will be described in detail with reference to the accompanying drawings. Referring to FIG. 5, in a $P^-$-type semiconductor substrate 21, and $N^-$-type buried region 22 containing an N-type impurity, for instance phosphorus in a concentration of $1 \times 10^{14}$ to $1 \times 10^{16}$ cm$^{-3}$, is formed. The depth of the N$^-$-type region 22 is suitably 2 to 25$\mu$. In the N$^-$-type region 22, N$^+$-type regions 23 and 24 are formed as respective source and drain regions at a spacing of 2 to 10$\mu$ from each other.

Between the N$^+$-type source and drain regions 23 and 24, a buried region 25 containing a P$^+$-type impurity, for instance boron, is formed to have an area of $1 \times 10^{10}$ to $1 \times 10^{12}$ cm$^2$ and a depth of 182. A first polycrystalline silicon layer 27 is formed over the P$^+$-type region 25 via a thin oxide film 26, for instance having a thickness of 800 Å, and a second polycrystalline silicon layer 29 is formed over the first via a thick oxide layer 28. The oxide layer 28 preferably has as large a thickness as possible for the least capacitance coupling between the first and second polycrystalline silicon layers 27 and 29.

One end of the second polycrystalline silicon layer 29 is in ohmic contact with the N$^+$-type region 24. The first polycrystalline silicon layer 27 preferably has as small sheet resistance as possible; preferably 200 $\Omega$/cm$^2$ or below. The second polycrystalline silicon layer 29, which is directly connected to the N$^+$-type region 24, is used as a resistor, and the resistance of its portion extending up to a contact hole 30 formed in an insulating layer 31 for an aluminum lead 33 is desirably 1 to 100 k$\Omega$. The insulating layer 31 is formed with another contact hole 32 to expose the N$^+$-type region 23, and an aluminum lead 34 is connected thereto.

Figure 6:
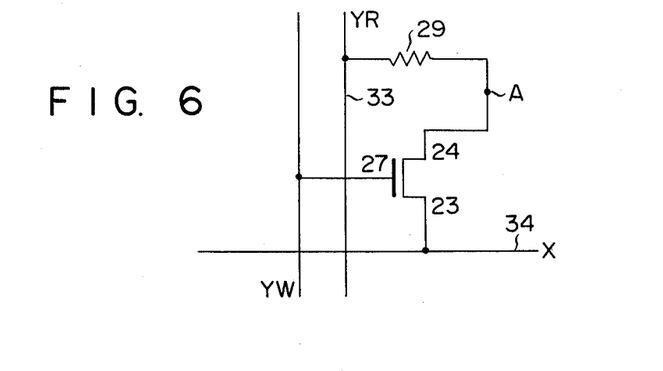
FIG. 6 is an equivalent circuit diagram of the memory cell shown in FIG. 5.

FIG. 6 shows an equivalent circuit diagram of the memory cell shown in FIG. 5. In the Figure, parts corresponding to those in FIG. 5 are designated by like reference numerals. As is shown, the first polycrystalline silicon layer 27 is used as gate of the transistor and also write line YW. The aluminum lead 33 connected to the second polycrystalline silicon layer 29 is used as read line YR when reading and writing data. The aluminum lead 34 which is directly connected to the N$^+$-type region 23 is used as select line X when reading and writing data.

Figure 7:
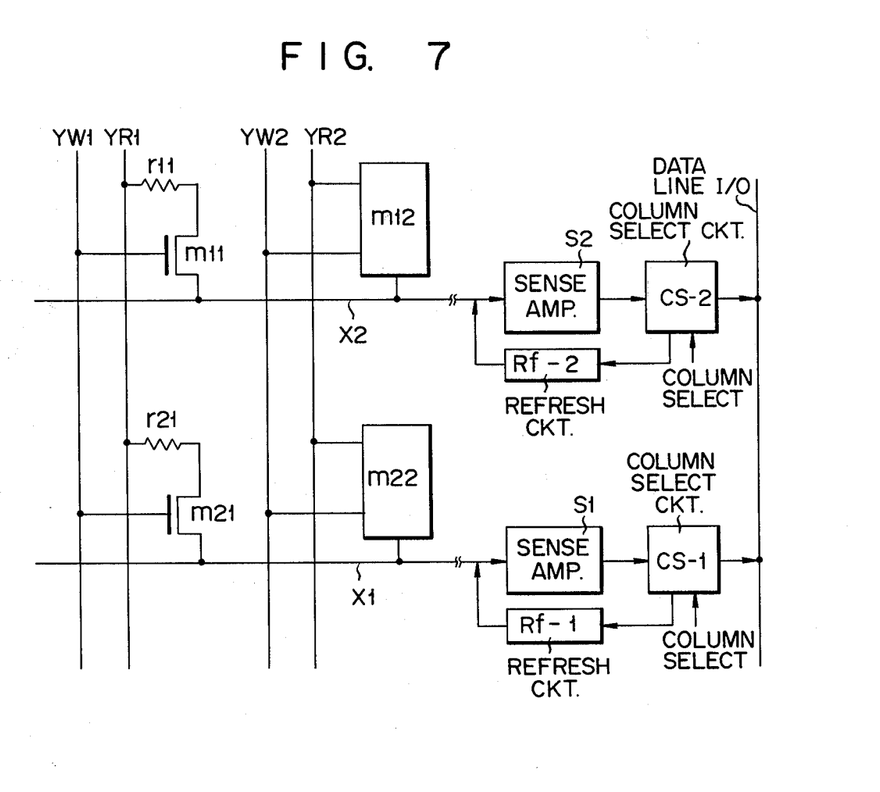
FIG. 7 is a schematic showing the circuit construction of a memory matrix employing FIG. 5 memory cells.

FIG. 7 shows a memory matrix which uses memory cells having the basic construction as shown in FIG. 5. In this circuit, four memory cells $m_{11}$, $m_{12}$, $m_{21}$ and $m_{22}$ are arranged in a matrix array. The memory cells $m_{11}$ and $m_{21}$ have their gates commonly connected to a line YW$_1$ and their respective resistors $r_{11}$ and $r_{21}$ connected at one end to a line YR$_1$. Likewise, the other memory cells $m_{12}$ and $m_{22}$ are connected to lines YW$_2$ and YR$_2$. A select line X$_2$ is connected to either N$^+$-type source or drain region of each of the memory cells $m_{11}$ and $m_{12}$, and a select line X$_1$ is similarly commonly connected to the memory cells $m_{21}$ and $m_{22}$. The select line X$_2$ is connected through a sense amplifier S$_2$ and a column select circuit CS-2 to a data line I/O, and likewise the select line X$_1$ is connected through a sense amplifier S$_1$ and a column select circuit CS-1 to the data line I/O. Refresh circuits Rf-2 and Rf-1 are connected in feedback paths formed from the output side of the column select circuits CS-2 and CS-1 to the input side of the sense amplifiers S$_2$ and S$_1$ respectively.

Figure 8:
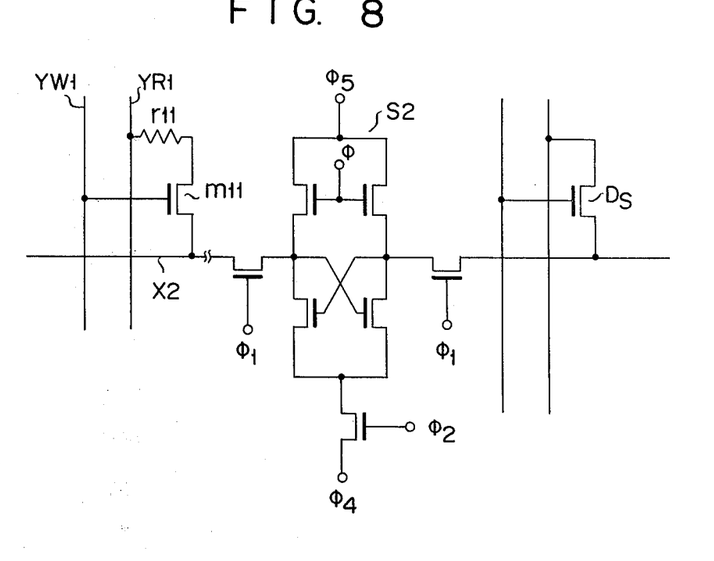
FIG. 8 is a circuit diagram showing a specific circuit construction of a sense amplifier portion of the circuit shown in FIG. 7.

FIG. 8 shows how a selected memory cell, for instance the cell $m_{11}$, is detected by the corresponding sense amplifier S$_2$. Actually, the sense amplifier detects a change of the conductance of the cell $m_{11}$ with reference to the conductance of a dummy cell DS. The dummy cell DS has the same construction as the memory cell $m_{11}$ except that the ratio between its channel length and width is substantially one half compared to that of the memory cell $m_{11}$. Mathematically, the length L$_C$ and width W$_C$ of the channel of the memory cell $m_{11}$ and the length L$_D$ and width W$_D$ of the dummy cell channel are set to satisfy a relation $$\frac{W_C}{L_C} \approx 2 \frac{W_D}{L_D} \qquad (1)$$

This means that the conductance ratio between the memory cell $m_{11}$ and dummy cell DS is set substantially to be 2:1. In other words, if the conductance level of the memory cell $m_{11}$ is "1" in the non-charged state of the cell $m_{11}$, the conductance level of the dummy cell DS is "0.5" in the non-charged state thereof. This conductance level of the dummy cell DS serves as a reference value, and the sense amplifier S$_2$ detects binary data "1" or "0" in terms of whether or not the reference value is above "0.5". The sense amplifiers used here are ratioless flip-flop sense amplifiers so that high sensitivity of detection, low power consumption and high speed of detection can be ensured.

While it has been mentioned above that the value of the ratio W/L between the memory cell and dummy cell is set to be 2:1, in general the conductance G$_D$ of the dummy cell may be set to satisfy a relation $$G_D = \frac{G_1 + G_0}{2} \qquad (2)$$

where G$_1$ the conductance of the memory cell corresponding to a "1" state thereof, and G$_0$ is the memory conductance corresponding to a "0" state.

Thus, if the conductance level G$_1$ is "1" and the conductance level G$_0$ is "0.5", the dummy cell conductance level G$_D$ is "0.75". In this case, the conductance ratio between the memory cell and dummy cell is 1:0.75, and the ratio W/L is 0.75:1. This means that all memory cell amplifiers satisfying equation (2) can be used as the sense amplifier for dynamic gain RAM memory cells making use of the changes of conductance level depending upon whether or not the cell is charged.

Figure 9:
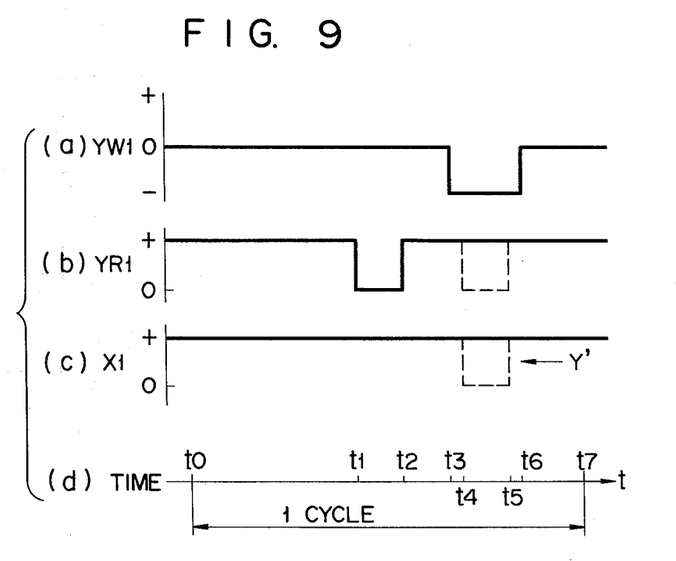
FIG. 9 is a time chart for illustrating the operation of the memory matrix shown in FIG. 7.

Now, the operation of the memory cell matrix shown in FIG. 7 will be described with reference to FIGS. 9(a) to 9(d). When the lines YW$_1$, YR$_1$ and X$_1$ shown in FIG. 7 are selected, at an instant t$_1$ shown in FIG. 9(d) the potential on the line YR$_1$ is changed from a high level of +5 V to a low level of 0 V, as shown in FIG. 9(b), thus causing current from the select line X$_1$ through the memory cell $m_{21}$ and resistor $r_{21}$.

This current is detected by the sense amplifier S$_1$, and data is output through the column select circuit CS-1 to the data line I/O. At the same time, the detected current is fed back through the refresh circuit Rf-1 to the input side of the sense amplifier S$_1$ for refreshing data. The refreshing operation is effected during a period between instants t$_4$ and t$_5$ shown in FIG. 9(d).

The effects of the above embodiment of the invention will now be discussed. In the circuit shown in FIG. 6, the potential on the node A of this memory cell may assume either a high (H) level or a low (L) level even though the read line YR may always been held at H level. This means that the line YR may be used as a common line, thus permitting the increase of the integration density. On the other hand, with the prior-art example shown in FIG. 1 both the lines Y and X have to be simultaneously held at either H or L level whenever writing the data "1". This means that two lead lines are required in practice as the respective lines Y and X, and this is undesired from the standpoint of the integration density increase.

In addition, in spite of the fact that the resistors 29 are provided each for each memory cell as shown in FIG. 6, the space factor of the memory cell is not practically increased at all by the provision of the resistor 29 since the resistor is constituted by the second polycrystalline layer 29 formed over the first polycrystalline silicon layer 27. Further, the contact hole 30 for the contact of the layer 29 with the aluminum lead 33 is formed over the gate 27 of the memory cell, and this does not increase the space factor of the cell at all. Furthermore, the number of lead lines for each memory cell is less by one than the case of the prior-art construction, and this is advantageous for the high density integration. Moreover, where the insulating layer 28 between the first and second polycrystalline silicon layers 27 and 29 in the construction of FIG. 5 is $SiO_2$ film, the capacitance between the layers 27 and 29 can be made very low by setting the thickness of the layer 28 to 2,000 to 8,000 Å, i.e., four to ten times 800 Å, the thickness of the layer 26 between the first polycrystalline silicon layer 27 and substrate 21. By so doing, a high speed memory cell array can be simply formed.

While the above embodiment has concerned with N-channel field-effect transistors, the same effects can also be obtained in case of P-channel transistors. Also, it is possible to replace the silicon substrate with other semiconductor substrates such as gallium arsenide (GaAs) substrate. In general, it is possible to make various changes and modifications of the essential construction according to the invention as shown in the equivalent circuit diagram of FIG. 6, with a resistive element connected to the read line YR, either the drain or source of the transistor connected to the node A, the other of the two, i.e., drain and source, used as the X select line, and the gate electrode formed on the insulating layer used as the write line YW.

Figure 10:
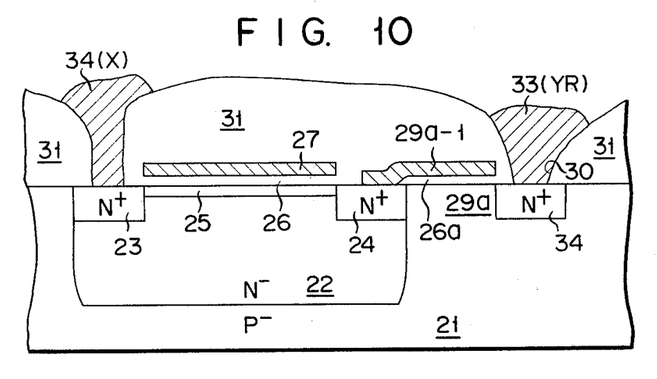
FIG. 10 is a pictorial sectional view showing a modification of the embodiment of FIG. 5.
Figure 11:
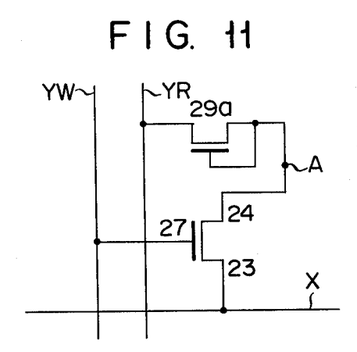
FIG. 11 is an equivalent circuit diagram of the memory cell shown in FIG. 10.

As a modification of the embodiment of FIG. 6, in which the resistor 29 is connected between the node A and read line YR, a field-effect transistor 29a with the gate and drain region thereof connected together may be used in lieu of the resistor 29 as shown in FIGS. 10 and 11. With this construction, the same effects can be obtained. The modified construction will now be described with reference to FIG. 10. In FIG. 10, like parts as in FIG. 5 are designated by like reference numerals.

In FIG. 10, adjacent to a field-effect transistor constituted by source and drain regions 23 and 24 and gate electrode 27 is provided another transistor 29a, which has separately formed source region 34 and gate electrode 29a-1 drain region 24 serves as the drain region of transistor 29a. The gate electrode 29a-1 is connected at one end to the drain region 24 and extends over the principal surface of substrate 21 via a thin insulating layer 26a up to the vicinity of the source region 34. The source region 34 is connected to aluminum lead 33 formed as read line YR in contact hole 33. As is shown in the equivalent circuit of FIG. 11, the field-effect transistor 29a in this modification is provided as a resistive element between node A, i.e., the drain region 24 of the adjacent field-effect transistor and read line YR. The operation of this modification is the same as the embodiment of FIG. 5.

Figure 12:
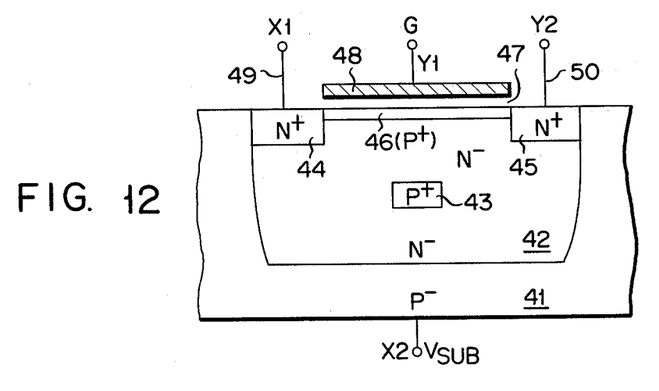
FIG. 12 is a pictorial sectional view showing a different embodiment of the invention applied to a dynamic gain RAM cell.
Figure 13:
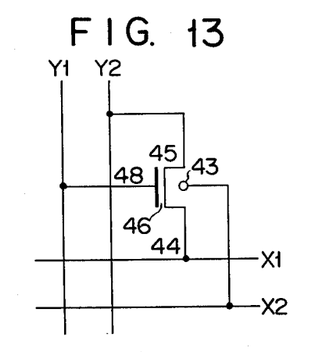
FIG. 13 is an equivalent circuit diagram of the memory cell shown in FIG. 12.

FIGS. 12 and 13 show another embodiment of the invention, which will now be described. Referring to FIG. 12, in a $P^-$-type semiconductor substrate 41 a first buried region 42 of $N^-$-type is formed on the side of the principal surface of the substrate 41, and a second buried region 43 of $P^+$-type is formed in the first buried region 42. In the first buried region 42 are also formed a pair of $N^+$-type regions 44 and 45 and a $P^+$-type region 46 between the regions 44 and 45, these regions 44 to 46 constituting a field-effect transistor. A gate electrode 48 is formed over the first buried region 42 via a thin insulating layer 47. To the $N^+$-type regions 44 and 45 are connected respective $X_1$ and $Y_2$ lines 49 and 50, and to the gate electrode 48 is connected a $Y_1$ line. The second buried region 43 is used as an $X_2$ line.

FIG. 13 shows an equivalent circuit diagram of the memory cell having the above construction. In the Figure, parts corresponding to those in FIG. 12 are designated by like reference numerals, and no particular description of this equivalent circuit diagram will be necessary. It is to be understood that the $Y_1$ line is a column line used for writing data, the $Y_2$ line is a column line used for reading data, the $X_1$ line is the row line used for reading data, and the $X_2$ line is the row line used for writing data.

Figure 14A:
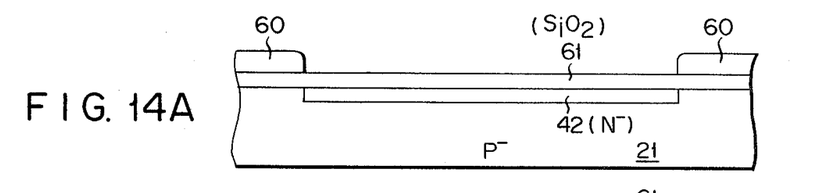
FIGS. 14A through 14G illustrate steps for manufacturing the memory cell of FIG. 12.
Figure 14B:
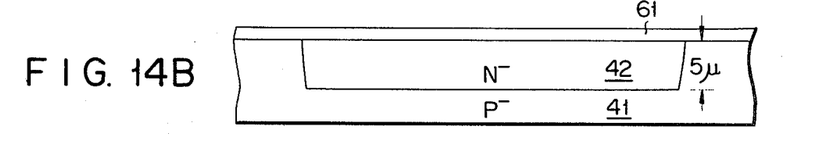
Figure 14C:
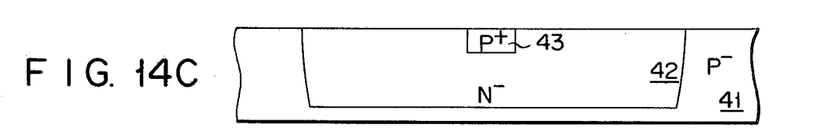
Figure 14D:
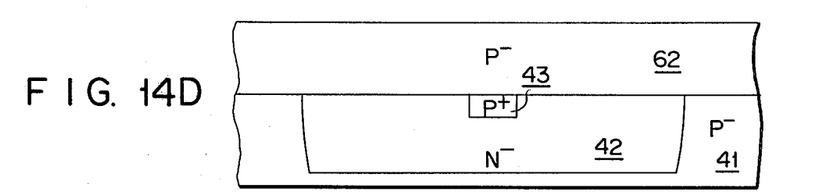
Figure 14E:
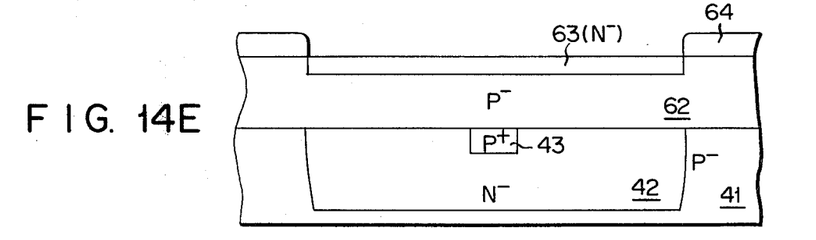

The manufacture of the memory cell of the embodiment of FIG. 12 will now be described with reference to FIGS. 14A through 14G. In the first step of the manufacture, the $N^-$-type layer 42 is formed by implanting phosphorus ions as impurity into the substrate 41, which has a resistivity of 50 Ω·cm, through a $SiO_2$ layer 61 with a photoresist 60 used as a mask until $5 \times 10^{13}$ phosphorus ions are implanted per square centimeter, as shown in FIG. 14A. Then, an $N^-$-type well 42 is formed through thermal diffusion of phosphorus to a depth of 5μ as shown in FIG. 14B. The impurity concentration of the $N^-$-type well 42 is thus $1 \times 10^{17}$ cm$^{-3}$. Subsequently, the $P^+$-type region 43 is formed through ion implantation of boron into the $N^-$-type region 42 until $1 \times 10^{13}$ boron ions are implanted per square centimeter as shown in FIG. 14C. Thereafter, a $P^-$-type layer 62 is formed atop the wafer by the epitaxial growth method such that it has an impurity concentration of $1 \times 10^{14}$ cm$^{-3}$, as shown in FIG. 14D. Then, an $N^-$-type layer 63 having a depth of 1μ and an impurity concentration of about $2 \times 10^{13}$ cm$^{-3}$ is formed by implanting phosphorus ions into the $N^-$-type region 42 with a photoresist layer 64 as a mask as shown in FIG. 14E.

Figure 14F:
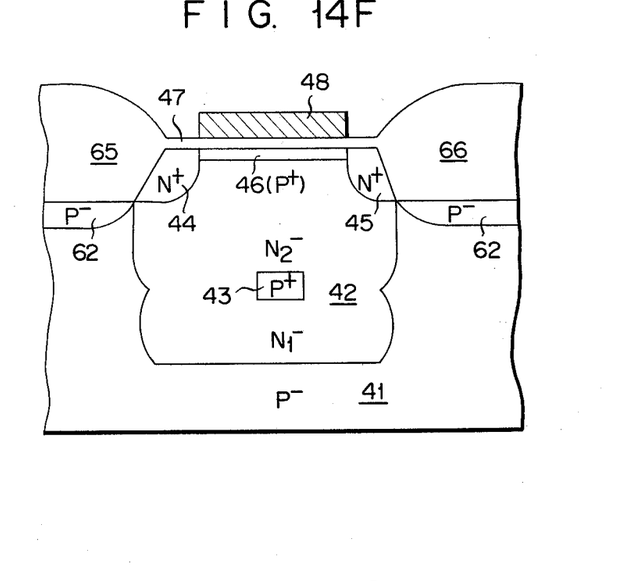

Afterwards, the photoresist 64 is removed, and $Si_3N_4$ layers as a mask (not shown) are formed to cover the $N^-$-type layer 63 for forming $SiO_2$ field layers 65 and 66 in its place as shown in FIG. 14F, by a field oxidation method. In the oxidation step, the phosphorus implantation layer 63 having been formed in the step 14E is expanded through impurity diffusion during a series of heat treatments in the oxidation step to reach and join the inner $N^-$-type region 42, and a memory cell structure in which the second buried region 43 is formed in the first buried region 42 is obtained. Also, the $P^-$-type region 62 which has been formed in the step of FIG. 14D is partly left under the field regions 65 and 66.

Then, the $P^+$-type region 46 is formed by implanting boron ions into a portion corresponding to the gate through the insulating layer 47 to a very shallow depth until $1 \times 10^{11}$ boron ions are implanted per square centimeter. Subsequently, the polycrystalline silicon layer 48 is formed on the insulating layer 47 and etched to the form of the gate electrode, and the source and drain regions 44 and 45 are formed through ion implantation of arsenic with the gate electrode used as a mask.

Figure 14G:
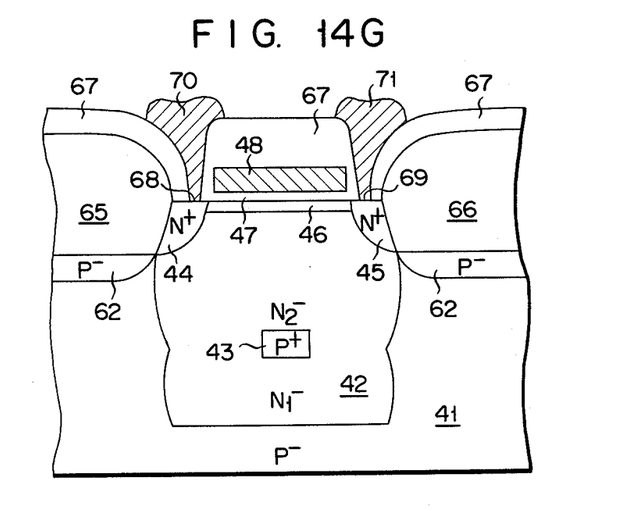

Finally, predetermined passivation and aluminum metallization steps are carried out to form aluminum leads 70 and 71 filling contact holes 68 and 69 formed in the insulating layer 67 and connected to the N+-type source and drain regions 44 and 45. In the above way, the memory cell as the second embodiment of the invention is completed.

Figure 15A:
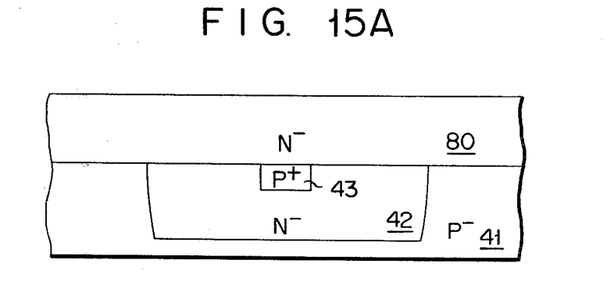
FIGS. 15A through 15C illustrate steps in a different example of the method of manufacturing the memory cell of FIG. 12.
Figure 15B:
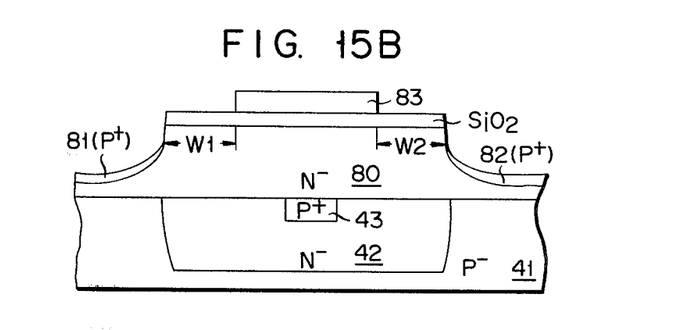
Figure 15C:
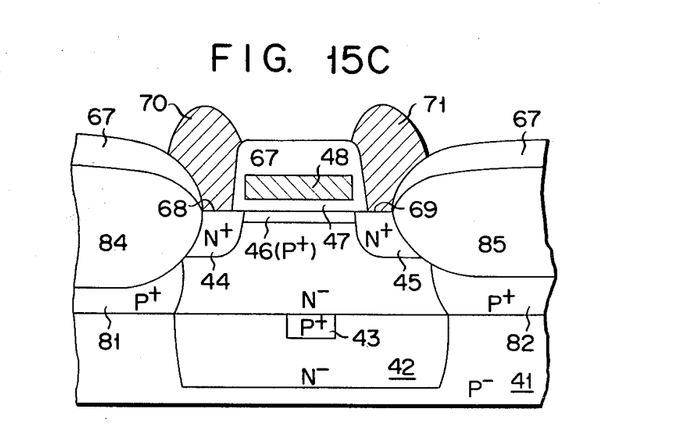

The steps of FIGS. 14D through 14G in the above manufacture may be replaced with steps shown in FIGS. 15A through 15C.

The step of FIG. 15A is different from the step of FIG. 14D only in that an N−-type region 80 having an impurity concentration of $1 \times 10^{15}$ cm$^{-3}$ and a thickness of about $3\mu$ is formed through epitaxial growth in lieu of the P−-type region 62. This N−-type region 80 is formed as single crystal of silicon. Subsequently, portions of the N−-type region 80 corresponding to anti-field-inversion regions to be formed are etched away to a depth of about 5,000 Å, and anti-field inversion regions 81 and 82 are formed through ion implantation of boron ions into the depressed portions as shown in FIG. 15B. Thereafter, field oxide layers 84 and 85 spaced apart from the anti-field-inversion regions 81 and 82 respectively by $W_1$ and $W_2$ ($W_1 \approx W_2$) are formed in the N−-type region 80 with a Si$_3$N$_4$ film 83 used as a mask as shown in FIGS. 15B and 15C. At the time of the formation of the field oxide layers 84 and 85, the anti-field-inversion regions 81 and 82 are expanded through impurity diffusion during the thermal treatment of the field oxidation step to reach the surface of the substrate 41. In other words, in this process of manufacture, no particular heat treatment step is needed for the formation of the anti-field-inversion regions 81 and 82.

The subsequent steps of forming the polycrystalline silicon layer 48 for the gate electrode, insulating cover 67, contact holes 68 and 69 and aluminum leads 70 and 71 are the same as the steps of FIGS. 14F and 14G.

Figure 16:
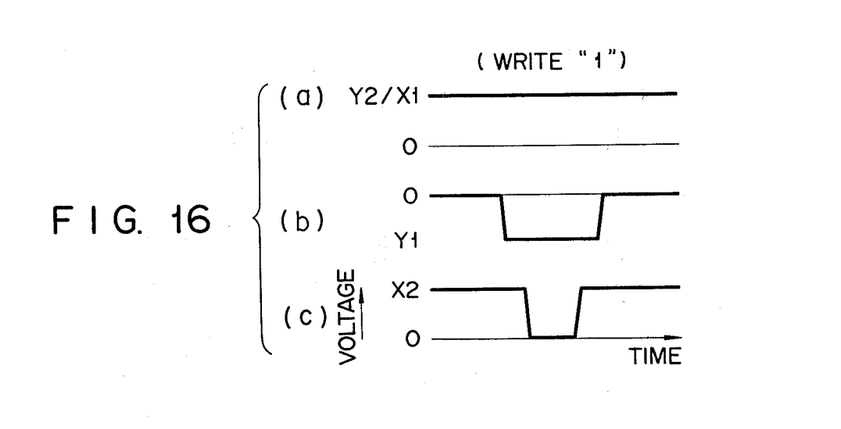
FIGS. 16 and 17 are time charts for illustrating the operation of the memory cell shown in FIG. 12.
Figure 17:
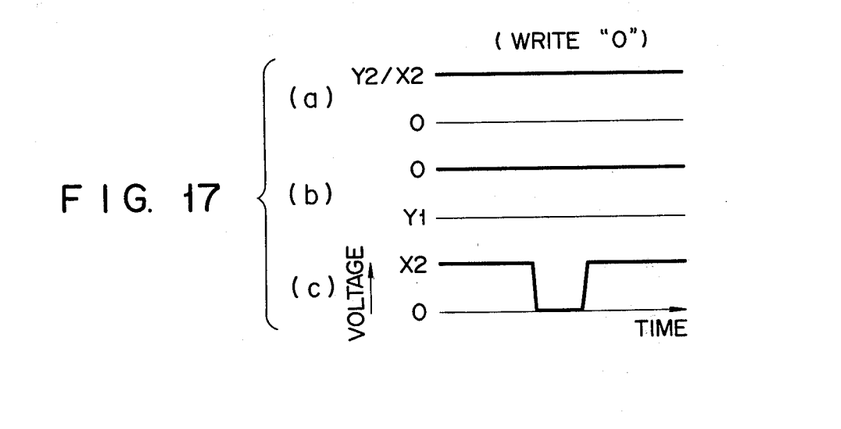

The operation of the memory cell shown in the equivalent circuit diagram of FIG. 13 will now be described by referring to FIGS. 16 and 17. FIG. 16 is a time chart illustrating the case of writing data "1" in the memory cell, and FIG. 17 is a time chart illustrating the case of writing data "0". In either case of FIG. 16 or 17, the read only lines X$_1$ and Y$_2$ are held at +5 V as shown in (a) in these Figures. In the case of writing data "1", the potential on the line X$_2$ is changed from +5 V to 0 V as shown in (c) in FIG. 16, and the potential on the line Y$_1$ is changed from 0 V to −5 V as shown in (b). In the case of writing data "0", the potential on the line Y$_1$ is held at 0 V as shown in (b) in FIG. 17, and the potential on the line X$_2$ is changed from +5 V to 0 V as shown in (c). When data "1" is written, plus charges are collected in the P+-type region 46 beneath the gate insulation layer 47 shown in FIG. 12. Thus, when reading this data "1", the conductance between the source 44 and drain 45 is at low level so that the data "1" can be read out. When data "0" is written, no plus charges are collected in the P+-type region 46. Thus, the conductance between the source 44 and drain 45 assumes high level to permit the reading of this data "0". In the above way, the writing and reading of the data "1" and "0" can be effected.

The merits of the embodiment of FIG. 12 will now be discussed. According to the embodiment a one-transistor-for-one-bit memory cell can be obtained. In addition, read and write lines are separately provided in spite of the fact that the integration density is increased compared to the prior-art construction. In particular, in the embodiment of FIG. 12 the P+-type region 46 and gate region 48 constituting a capacitor for holding stored data "1" and "0" serve as the gate electrode for the field-effect transistor (constituted by the regions 42, 44 and 45) for reading data, and the space factor per bit is reduced.

Further, according to the embodiment of FIG. 12 a line for controlling the writing of data is provided. In the embodiment of FIG. 12 the second buried layer 43 constitutes it. By virtue of the presence of this buried layer, it is possible to reliably write data in a selected memory cell in a memory cell matrix.

Furthermore, the writing control line 43 is provided beneath the P+-type regions 46 and 48 for charge storage. This means that in spite of the fact that the number of lines is increased by the line 43, this does not lead to any increase of the space factor per bit, and a memory cell which permits ready designing of a high density write/read system is realized.

Still further, as is clear from the above description of the manufacturing steps of FIGS. 15A through 15C, the second buried layer can be readily formed by epitaxially growing the N-type silicon layer atop the N−-type well and appropriately etching it.

While the above embodiments have concerned with N-channel field-effect transistors, it is of course possible to use P-channel field-effect transistors as well.

Also, while the P+-type region 46 in the embodiment of FIG. 12 has been used for storing charge, it is also possible to use any other charge storage section in lieu of the P+-type region. In general, a dynamic gain memory cell, which includes the buried layer 43, and in which charge is stored on the substrate surface or in other portions to control in effect the conductance of the field-effect transistor, is the gist of the invention, and various changes and modifications can be made without departing from the scope of this invention.

What is claimed is:

1. A semiconductor memory device comprising:
    a semiconductor substrate;
    a plurality of dynamic gain memory elements formed on the surface of said semiconductor substrate, each of the memory elements having a gate electrode and channel electrodes comprising source and drain electrodes;
    a plurality of resistive elements each corresponding to a different memory element and each having two ends, one end of each of said resistive elements being connected to one of the channel electrodes of the corresponding memory element;
    a first column line to which the ends of said resistive elements not connected to the memory element channel electrodes are commonly connected for reading data;
    a second column line to which the gate electrodes of said memory elements are commonly connected for writing data; and
    a plurality of row lines for reading and writing data, said row lines being connected to the memory elements channel electrodes not connected to said resistive elements.

2. A semiconductor memory device according to claim 1, wherein said gate electrodes of said memory elements and said plurality of resistive elements are constituted by respective first and second polycrystalline silicon layers, said second polycrystalline silicon layer that serves as said resistive element being formed over said first polycrystalline silicon layer that serves as said gate electrode via a thick insulating film.

3. A semiconductor memory device according to claim 1, wherein said memory elements are field-effect transistors.

4. A semiconductor memory device comprising a semiconductor substrate of a first conductivity type, a first buried region of a second conductivity type formed in said substrate along the principal surface thereof, a second buried region of the first conductivity type formed in said first buried region, and a field-effect transistor having source and drain regions of the second conductivity type formed in said first buried region, the gate electrode of said field-effect transistor being formed over a portion of the substrate principal surface between the source and drain regions via a gate insulating film.

5. A semiconductor memory device according to claim 4, wherein said second burried region is located beneath a channel region formed between the source and drain regions of said field-effect transistor.

6. A semiconductor memory device according to claim 1 or 4, wherein said field-effect transistor is combined with a field-effect transistor circuit which detects the change of the conductance of the field-effect transistor thereby to read binary data from the first field-effect transistor, said circuit including a dummy field-effect transistor having conductance which is half the sum of a first conductance corresponding to a first binary data and a second conductance corresponding to a second binary data.

7. A semiconductor memory device according to claim 6, wherein said field-effect transistor circuit further includes a flip-flop sensing amplifier which reads data from said field-effect transistor, using the conductance of said dummy field-effect transistor as a reference conductance.

8. A semiconductor memory device according to claim 6, wherein said field-effect transistor has a first channel length and a first channel width and said dummy field-effect transistor has a second channel length which is half the first channel length or a second channel width which is half the first channel width.

9. A semiconductor memory according to claim 2 wherein each of said resistive elements includes a field-effect transistor formed adjacent to the corresponding memory element field effect transistor, each memory element channel electrode connected to one of said resistive elements serving as the same electrode of its corresponding resistive element field-effect transistor and being connected to the corresponding resistive element transistor's gate electrode, the electrode of each of said resistive element field-effect transistors not connected to a memory cell being connected to said first column line for reading data.

10. A semiconductor memory device according to claim 1, wherein each of said resistive elements is constituted by a field-effect transistor formed adjacent to its corresponding memory element, each memory element channel electrode connected to one of said resistive element field-effect transistors serving as the same electrode of its corresponding resistive element field-effect transistor and being connected to the corresponding resistive element transistor's gate electrode, the electrode of each of said field-effect transistors not connected to a memory element being connected to said first column line for reading data.

* * * * *